United States Patent [19]

Bartush

[11] Patent Number: 5,385,866

[45] Date of Patent: Jan. 31, 1995

[54] POLISH PLANARIZING USING OXIDIZED BORON NITRIDE AS A POLISH STOP

[75] Inventor: Thomas A. Bartush, Wappingers Falls, N.Y.

[73] Assignee: International Business Machines Corporation, Armonk, N.Y.

[21] Appl. No.: 263,969

[22] Filed: Jun. 22, 1994

[51] Int. Cl.6 .................. H01L 21/28; H01L 21/304
[52] U.S. Cl. ..................... 437/186; 437/236; 437/228; 156/636
[58] Field of Search ............... 156/636; 437/186, 228, 437/236; 257/635, 640, 641, 644

[56] References Cited

U.S. PATENT DOCUMENTS

| | | | |
|---|---|---|---|
| 4,666,556 | 5/1987 | Fulton et al. | 156/643 |
| 4,668,336 | 5/1987 | Shimkunas | 156/643 |
| 5,064,683 | 11/1991 | Poon et al. | 427/39 |
| 5,066,533 | 11/1991 | America et al. | 428/156 |
| 5,077,235 | 12/1991 | Kosaka | 437/72 |
| 5,200,358 | 4/1993 | Bollinger et al. | 437/186 |
| 5,324,690 | 6/1994 | Gelatos et al. | 437/236 |

OTHER PUBLICATIONS

"Auger Electron Spectroscopy/Scanning Auger Microanalysis", Modern Methods of Analytical Chemistry, The Analytical Laboratories, The Dow Chemical Company, compiled by C. E. Van H all, 1985, pp. 41–43.

IBM TDB entitled "Improved Isolation and Gate Level Formation Process", by H. Ng, et al., No. 11, 04-92, pp. 197–199, Apr. 1992.

Primary Examiner—George Fourson
Assistant Examiner—Thomas G. Bilodeau
Attorney, Agent, or Firm—Richard Lau

[57] ABSTRACT

Polishing of a non-planar surface layer on a semiconductor substrate is conducted by providing an oxidized boron nitride polish stop layer on the semiconductor substrate, forming the non-planar surface layer on the oxidized boron nitride polish stop layer, the oxidized boron nitride polish stop layer being polish selective relative to the non-planar surface layer, and polishing the non-planar surface layer until the oxidized boron nitride polish stop layer is reached.

11 Claims, 5 Drawing Sheets

5,385,866

POLISH PLANARIZING USING OXIDIZED BORON NITRIDE AS A POLISH STOP

TECHNICAL FIELD

The present invention relates generally to semiconductor fabrication processing and, more specifically, to such processing using chemical-mechanical polishing and, even more specifically, to polish stops for chemical-mechanical polishing.

BACKGROUND OF THE INVENTION

As successive layers of conductive and dielectric materials are deposited during fabrication of semiconductor devices, unevenness often develops in the surface topography of the layers, i.e., certain surface regions of a layer become elevated relative to other surface regions of the layer. As such, surface topographies generally need to be planarized for further processing. Chemical-mechanical (chem-mech) polishing is one method of planarizing such surfaces. During chem-mech polishing, the surface is brought into contact with a rotating polish pad in the presence of an abrasive slurry. A portion of the surface is then abrasively removed by the mechanical action of the polish pad and the chemical action of the slurry.

One difficulty encountered during chem-mech polishing is that polishing rates vary considerably for different materials and different regions. Thus, care must be observed to avoid overpolishing of an overlying layer so as to cause damage to an underlying layer.

Polish selectivity is a comparison of the removal rate of one material relative to that of another material. Polish selectivity is a mechanism often exploited to avoid unintentional polishing of a material. In this regard, a polish stop comprises material that is more resistant to the effects of chem-mech polishing in comparison to other material, i.e., the polish stop material is polish selective to the other material. The polish stop can thus be strategically positioned so as to indicate when the chem-mech polishing should be terminated so that damage to an underlying material due to overpolishing can be avoided.

As a specific example, in order to fabricate a gate for utilization in certain present day semiconductor devices, a gate stack is designed with a doped polysilicon conductor, a titanium silicide cap on the polysilicon conductor, and an insulating cap oxide on the titanium silicide cap. Reactive-ion-etching is implemented to define the shape of the gate; and spaces adjacent to the gate resulting from the reactive-ion-etching are filled with polysilicon. Although polysilicon is a conductor, and not an insulator, the spaces are filled with polysilicon in this manner in order to form a polysilicon mandrel. Use of polysilicon as a mandrel takes advantage of the chem-mech polish selectivity between polysilicon and oxide. In this regard, the chem-mech polish selectivity allows the polysilicon mandrel to be polished down to the oxide gate cap, such that a "hard" stop is realized at the oxide gate cap. A polysilicon cap extension is then deposited, contact holes are etched into the polysilicon, and the contact holes are filled with material appropriate for forming contact studs, such as tungsten. Planarization of the structure is then achieved by chem-mech polishing. The hard stop of chem-mech polishing of polysilicon on oxide allows for reduction in chem-mech polishing tolerances across the wafer so that the height of each of the contact studs can be made to be uniform. The polysilicon mandrel must then be removed after the tungsten studs are formed, and replaced with appropriate insulative material, such as Phosphorous-Silicate Glass (PSG) oxide. Unfortunately, the additional processing required to remove the polysilicon mandrel, refill with PSG oxide, and replanarize is time-consuming, inefficient and costly.

Further, it is extremely difficult to completely remove all the polysilicon during the reactive-ion-etching step. More specifically, it has been found to be virtually impossible to remove all the polysilicon from the re-entrant slopes on the gates and regions under the tungsten studs. Incomplete removal of polysilicon frequently results in undesirable contact-to-contact shorting or leakage.

Thus, there remains a need for a polish stop which will allow for improved efficiency and cost-effectiveness during semiconductor manufacturing.

SUMMARY OF THE INVENTION

Generally, the present invention relates to a method of polishing a non-planar surface layer on a semiconductor substrate by providing an oxidized boron nitride polish stop layer on the semiconductor substrate, forming a non-planar surface layer on the oxidized boron nitride polish stop layer, the oxidized boron nitride polish stop layer being polish selective relative to the non-planar surface layer, and polishing the non-planar surface layer until the oxidized boron nitride polish stop layer is reached.

BRIEF DESCRIPTION OF THE DRAWINGS

Objects, features, aspects and advantages of the present invention will be more readily apparent and better understood from the following detailed description of the invention, in which.

DETAILED DESCRIPTION OF THE PREFERRED EMBODIMENT

Figure 1A:
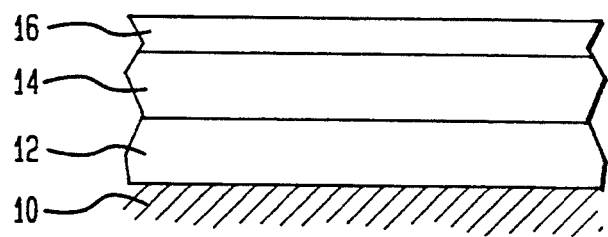
FIGS. 1A–F show process steps for fabrication of a semiconductor device using oxidized boron nitride as a polish stop in accordance with the present invention.

Referring initially to FIG. 1A, in order to form a typical gate stack, conventional techniques are used to deposit a polysilicon layer 12 on a semiconductor substrate 10, and to deposit an insulating capping film 14 on the polysilicon layer 12. The insulating capping film 14 comprises, for example, nitride or oxide. In accordance with the present invention, a boron nitride layer 16 is then deposited on the gate stack or, more specifically, on the insulating capping film 14. The thickness of the boron nitride layer 16 can be on the order of approximately 1000 Angstroms.

Figure 1B:
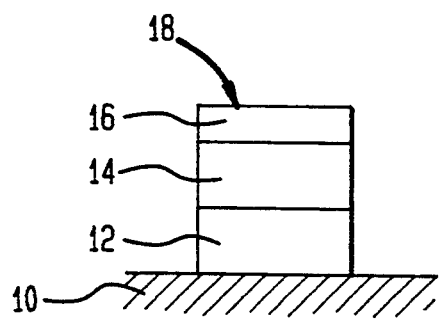

Conventional lithography procedures are then used to define an appropriate pattern in photoresist (not shown), and the boron nitride layer 16 is selectively removed using well known reactive ion etching techniques. Reactive ion etching techniques have shown that boron nitride etches at approximately the same rate as $Si_3N_4$. The remaining gate stack materials or, more specifically, the insulating capping film 14 and the polysilicon layer 12 are then also removed by conventional reactive ion etching techniques. The photoresist is subsequently stripped, and the resulting gate structure 18 is shown in FIG. 1B.

In order to form the device, the sidewalls of the gate conductor or polysilicon layer 12 must now be electrically isolated. This is typically accomplished by oxidizing the sidewalls of the polysilicon layer 12 using standard annealing processes, such as rapid thermal oxidation. Oxidized sidewalls 12' are thus created. Process parameters for conducting such rapid thermal oxidation include pressure of atmospheric pressure, flow of 3 ml of oxgyen, heating of the wafer surface (using, for example, a quartz lamp) to approximately 850 degress Celsius, and process time of approximately 60 seconds. Advantageously, in accordance with the present invention, in addition to oxidizing the sidewalls of the polysilicon layer 12, the rapid thermal oxidation process also oxidizes the boron nitride layer 16, and the oxidized boron nitride layer 16' is thus created. The composition and characteristics of the oxidized boron nitride layer 16' will be discussed in further detail hereinbelow.

Figure 1C:
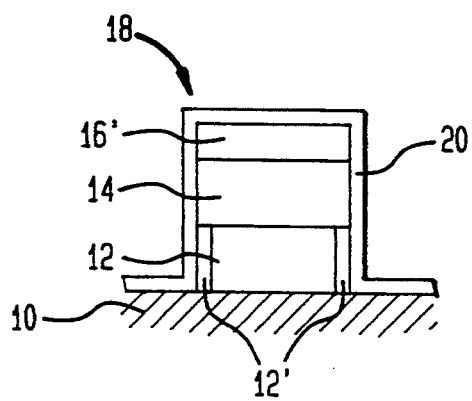

As shown in FIG. 1C, in order to protect the gate structure 18, a barrier film 20 comprising, for example, nitride, is then deposited on the gate structure 18, and on the substrate 10 adjacent to the gate structure 18. In this context, the term "protect" means to provide a mobile ion barrier comprising, in this example, nitride.

Figure 1D:
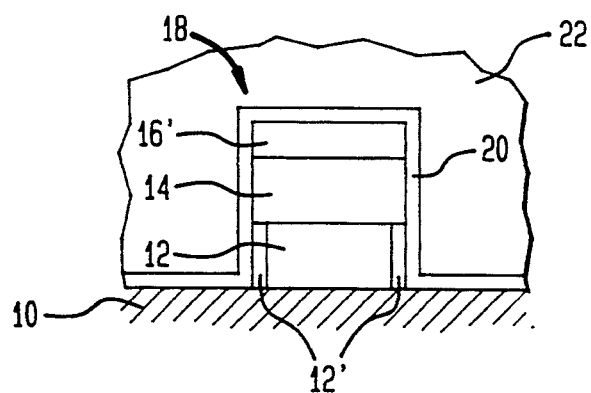

Next, referring to FIG. 1D, in order to insulate and electrically separate the gate structure 18 from other structures or devices on the substrate 10, the area or region adjacent to the gate structure 18, or between the gate structure 18 and another structure or device on the substrate 10, is filled with an insulating layer 22. Such insulating layer 22 can be an oxide, typically phosphorous-silicate glass. Deposition of the insulating layer 22 is such that it fills the voids between the gate structure 18 and another structure on the substrate 10, but such deposition is distinctly non-planar.

Figure 1E:
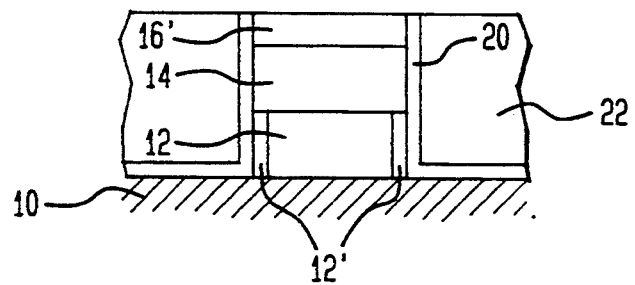

As shown in FIG. 1E, the insulating layer 22 and barrier film 20 are then planarized to the top of the gate structure 18. This is accomplished by chemical-mechanical polishing. Advantageously, the oxidized boron nitride layer 16' provides excellent polish selectivity to the other film and layer, specifically, the nitride barrier film 20 and the insulating layer 22. With the high polish selectivity of the oxidized boron nitride layer 16', the oxidized boron nitride layer 16' functions as a highly effective polish stop for the chemical-mechanical polishing, and allows the chemical-mechanical polishing process to "hard stop" on top of the gate structure 18. Additionally, overpolishing can be performed to remove non-uniformities resulting from the chemical-mechanical polishing without fear of attacking the gate structure 18. As such, the resulting thickness is primarily a function of the tolerances in the deposition of the gate stack films, such tolerances typically being less than about +/−10%.

Figure 1F:
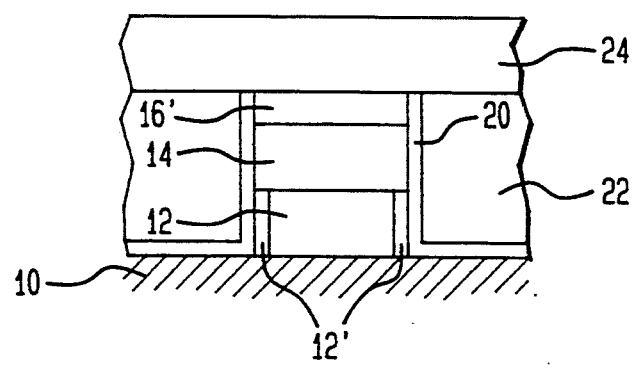

As shown in FIG. 1F, subsequent to planarization, the process can continue as required, such as with standard deposition of a mandrel extension oxide layer 24. Conventional drilling of contact holes, and subsequent wiring levels to connect the various devices on the substrate 10 can then follow.

In regard to the oxidized boron nitride layer 16', as shown in the Auger analysis and explained further hereinbelow, this layer 16' is now substantially free of boron. Theory suggests that the boron in the original boron nitride layer 16 reacts with oxygen during the rapid thermal oxidation process to form boric acid. Since boric acid is volatile at the pressure and temperature at which the rapid thermal oxidation process is performed, specifically, pressure on the order of atmospheric pressure and temperature of approximately 850 degrees Celsius, the boric acid vaporizes or evaporates.

Advantageously, although the material resulting from the oxidizing of the boron nitride is substantially devoid or free of boron, it has been found that such oxidized boron nitride material retains the polish stop properties of the original boron nitride, thus allowing for the oxidized boron nitride layer 16' to function effectively as a polish stop during chemical-mechanical polishing, as described hereinabove. Such oxidized boron nitride material, substantially free of boron, is completely compatible with typical semiconductor processes. In this regard, the boron contained in the boron nitride should not be left on the gate structure after polishing, since boron may cause unpredictable problems, such as adhesion of other films to boron nitride, during the subsequent encapsulation and annealing. As such, unlike boron nitride, the oxidized boron nitride material can remain as part of the final product.

Figure 2:
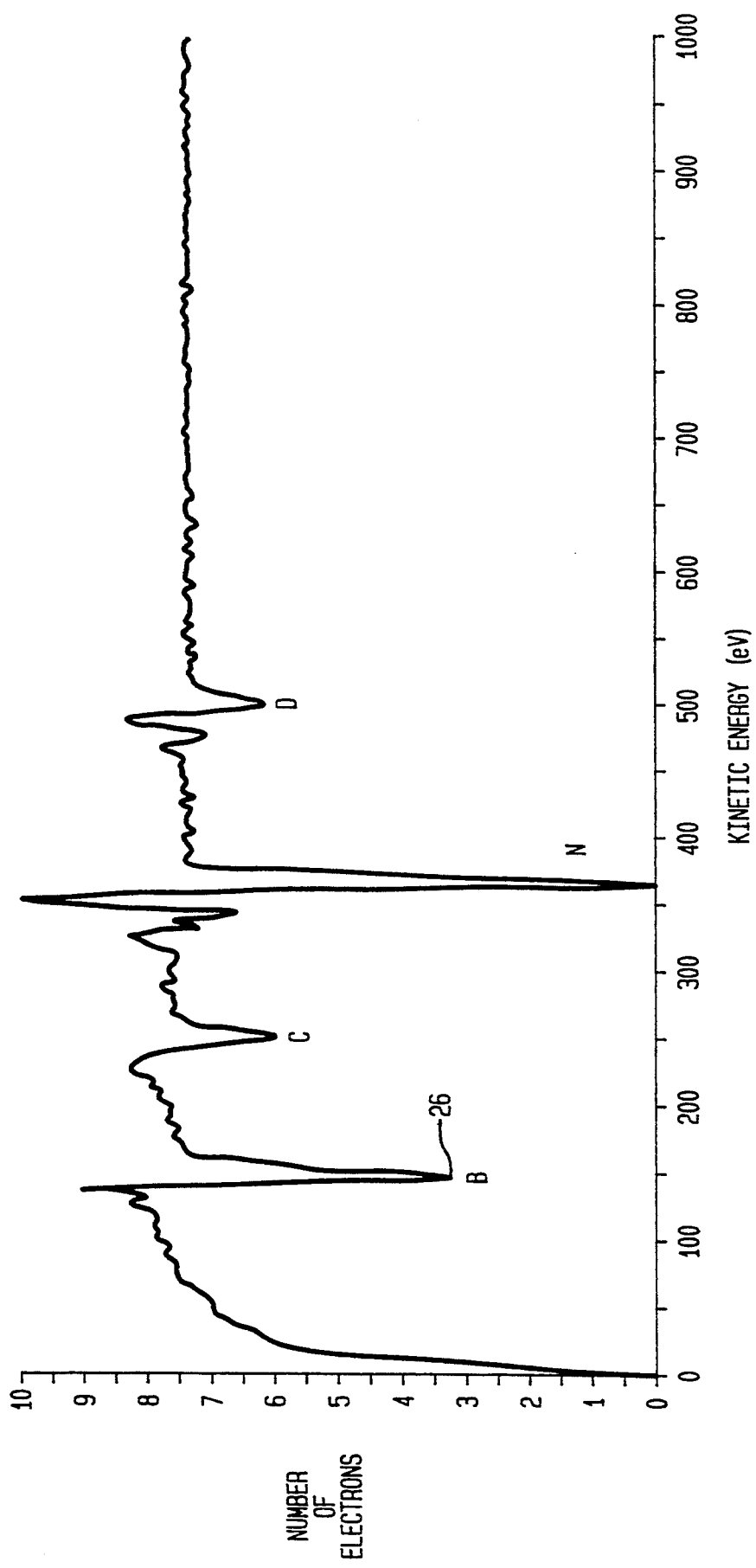
FIG. 2 is a plot generated from Auger analysis of boron nitride.
Figure 3:
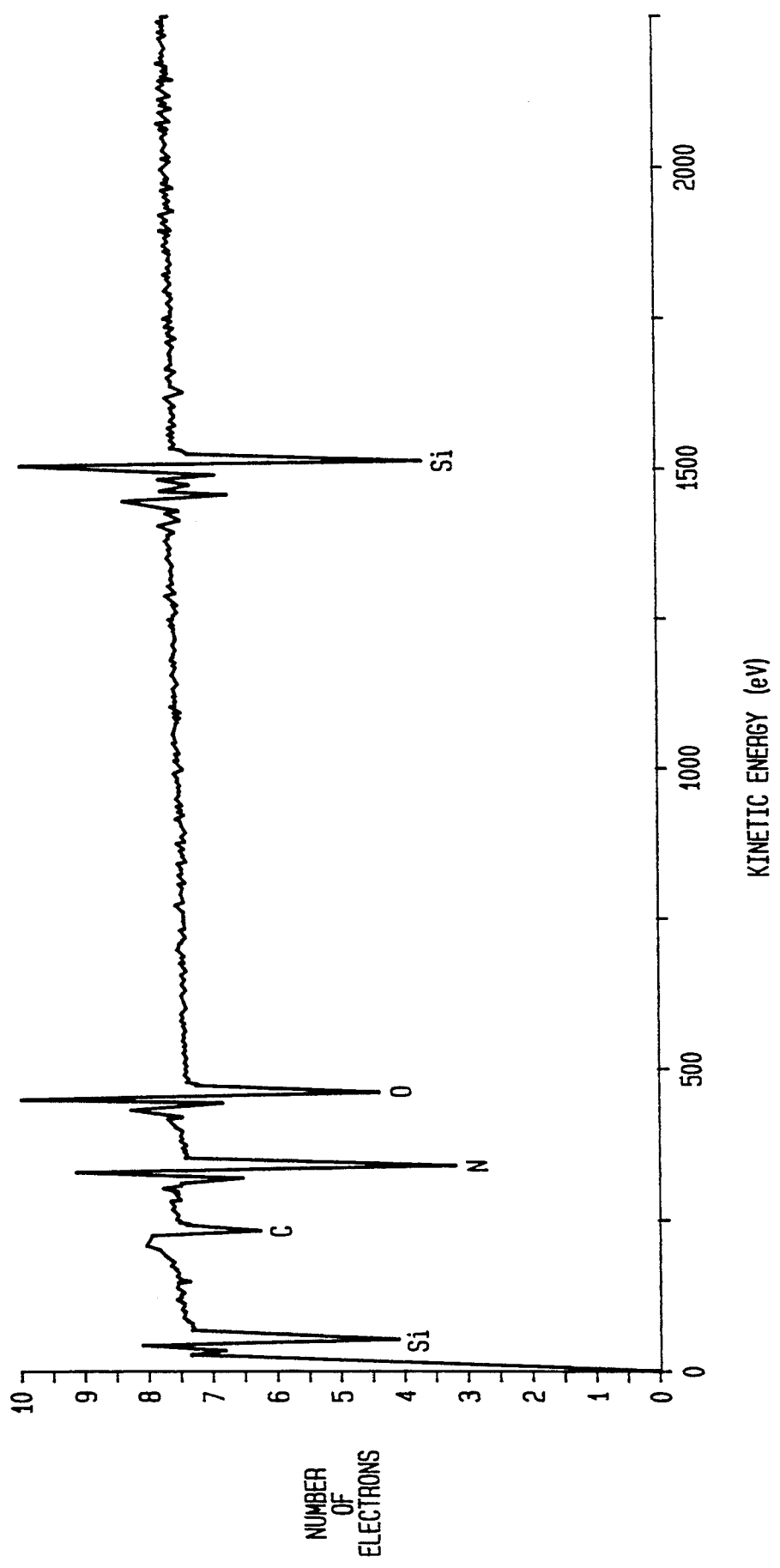
FIG. 3 is a plot generated from Auger analysis of oxidized boron nitride produced in accordance with the present invention.

Auger analysis was performed on boron nitride and compared with Auger analysis on the oxidized boron nitride material. Auger analysis allows for determination of the composition of a material by radiationless relaxation of an atom involving a vacancy in an inner electron shell, in which an electron is emitted and referred to as an Auger electron. For a general discussion of Auger analysis, see, for example, "Auger Electron Spectroscopy/Scanning Auger Microanalysis", *Modern Methods of analytical Chemistry*, The Analytical Laboratories, The Dow Chemical Company, compiled by C. E. Van Hall, 1985, pp. 41–43. Parameters under which the Auger analysis was performed include a beam current of 13 nA and a beam voltage of 10 KeV. The results of the Auger analysis of boron nitride are shown in the plot of FIG. 2. As labelled in the plot, each spike in the plot indicates the presence of a certain material. Accordingly, the boron nitride was found to contain boron, carbon, nitrogen and oxygen. The spike labelled with reference numeral 26 clearly indicates that, as expected, a significant amount of boron was found to be present in the boron nitride. The plot of FIG. 3 shows the results of the Auger analysis of the oxidized boron nitride material. It can be seen that no traceable amounts of boron were found in the oxidized boron nitride, and thus boron is substantially absent from the oxidized boron nitride. The traceable elements that were found to be present in the oxidized boron nitride are silicon, carbon, nitrogen, and oxygen. The traces of carbon that were found to be present in the oxidized boron nitride were determined to be of no consequence during the subsequent processing or in the final product.

Figure 4:
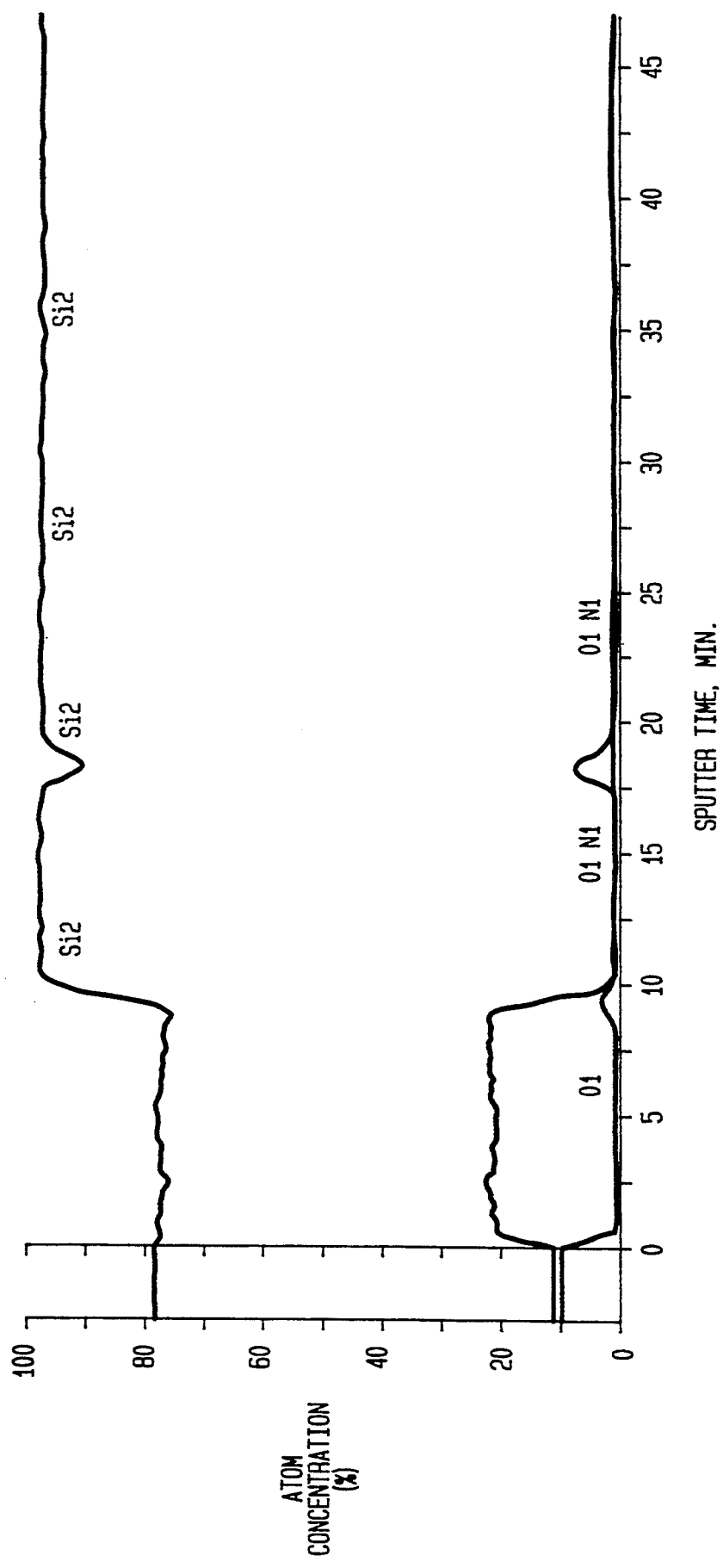
FIG. 4 is a plot generated from Auger analysis of underlying structure below oxidized boron nitride produced in accordance with the present invention.

Sputtering was then continued through the oxidized boron nitride material 16', and into the underlying structure, to determine if the boron was driven deeper into the device. As shown in FIG. 4, the results of the Auger analysis of the underlying structure indicates that oxygen, nitrogen and silicon are present, and no traceable amounts of boron are present. Accordingly, it was concluded that the boron was evidently not driven deeper into the device.

Although the present invention has been described hereinabove with specific reference to fabrication of a gate of a semiconductor device, it should be understood that the invention can be applied to fabrication of other structures. In this regard, it should be readily apparent to those skilled in the art that the present invention can be applied to fabrication of other structures which require a polish stop during polish planarizing. Another example includes use as a polish stop at the active area planarization when chem-mech polishing is used to planarize shallow trench isolation oxide with the active area single crystal area. In this regard, by forming oxidized boron nitride on top of the single crystal before etching the active area shapes, the chem-mech polish selectivity between oxidized boron nitride and oxide can be used advantageously. Further, the chem-mech polish selectivity of oxidized boron nitride may also be beneficial in trench planarization as well.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method of polishing a non-planar surface layer on a semiconductor substrate, comprising the steps of:
   (a) providing a semiconductor substrate;
   (b) providing an oxidized boron nitride polish stop layer on said semiconductor substrate wherein the oxidized boron nitride polish stop layer is substantially free of boron;
   (c) forming a non-planar surface layer on said oxidized boron nitride polish stop layer, said oxidized boron nitride polish stop layer being polish selective relative to said non-planar surface layer; and
   (d) polishing said non-planar surface layer until said oxidized boron nitride polish stop layer is reached.

2. A method according to claim 1, wherein step (b) comprises depositing a layer of boron nitride and thermally oxidizing layer of boron nitride for forming the oxidized boron nitride polish stop layer.

3. A method according to claim 2, wherein said layer of boron nitride has a thickness of about 1000 Angstroms.

4. A method according to claim 2, wherein said step of thermally oxidizing the layer of boron nitride comprises rapid thermal oxidation for a process time of approximately 60 seconds.

5. A method according to claim 4, wherein said rapid thermal oxidation is conducted at atmospheric pressure, a flow of 3 ml of oxygen, heating of said semiconductor substrate to approximately 850 degrees Celsius, and a process time of approximately 60 seconds.

6. A method of forming a gate of a semiconductor device, comprising the steps of:
   providing a semiconductor substrate;
   forming a gate structure on said semiconductor substrate, said gate structure having a boron nitride layer on top thereof;
   oxidizing said boron nitride layer so as to form an oxidized boron nitride layer which is substantially free of boron;
   forming a non-planar insulating layer over said oxidized boron nitride layer for insulating said gate structure from other structures, said oxidized boron nitride layer being polish selective relative to said non-planar insulating layer; and
   polishing said non-planar insulating layer until said oxidized boron nitride layer is reached.

7. A method according to claim 6, wherein said boron nitride layer has a thickness of about 1000 Angstroms.

8. A method according to claim 6, wherein said gate structure includes a polysilicon layer having sidewalls, and wherein said sidewalls of said polysilicon layer are oxidized during said step of oxidizing said boron nitride layer.

9. A method according to claim 8, said step of oxidizing said boron nitride layer comprises thermally oxidizing 10. A method according to claim 9, wherein said step thermally oxidizing comprises rapid thermal oxidation for a process time of approximately 60 seconds.

11. A method according to claim 10, wherein said rapid thermal oxidation is conducted at atmospheric pressure, a flow of 3 ml of oxygen, heating of said semiconductor substrate to approximately 850 degrees Celsius, and a process time of approximately 60 seconds.

* * * * *